(12) United States Patent
Snow

(10) Patent No.: US 8,146,408 B2
(45) Date of Patent: Apr. 3, 2012

(54) METHOD FOR TESTING GAS TURBINE ENGINES

(75) Inventor: Barton Hunter Snow, Wyoming, OH (US)

(73) Assignee: General Electric Company, Schenectady, NY (US)

( * ) Notice: Subject to any disclaimer, the term of this patent is extended or adjusted under 35 U.S.C. 154(b) by 26 days.

(21) Appl. No.: 13/032,958

(22) Filed: Feb. 23, 2011

(65) Prior Publication Data

US 2011/0138897 A1    Jun. 16, 2011

Related U.S. Application Data

(62) Division of application No. 11/485,493, filed on Jul. 12, 2006, now Pat. No. 7,966,804.

(51) Int. Cl.
*G01M 15/14* (2006.01)

(52) U.S. Cl. .................................................. 73/112.01

(58) Field of Classification Search ............... 73/112.01, 73/112.03, 114.68, 118.03
See application file for complete search history.

(56) References Cited

U.S. PATENT DOCUMENTS

| | | | |
|---|---|---|---|
| 3,623,546 A | 11/1971 | Banthin et al. | |
| 4,645,450 A | 2/1987 | West | |
| 5,099,436 A | 3/1992 | McCown et al. | |
| 5,146,941 A | 9/1992 | Statler | |
| 5,490,414 A | 2/1996 | Durschmidt et al. | |
| 5,586,252 A | 12/1996 | Bernard et al. | |
| 5,974,865 A | 11/1999 | Dambach | |
| 6,415,595 B1 | 7/2002 | Wilmot et al. | |
| 6,456,928 B1 | 9/2002 | Johnson | |
| 6,621,021 B2 | 9/2003 | Pechhold et al. | |
| 6,651,440 B2 | 11/2003 | Tanaka et al. | |
| 6,741,919 B1 | 5/2004 | Schuster et al. | |
| 6,810,674 B2 | 11/2004 | Clements | |
| 6,883,121 B1 | 4/2005 | Jensen et al. | |
| 6,909,960 B2 | 6/2005 | Volponi et al. | |
| 6,912,895 B1 * | 7/2005 | Jaeger | 73/114.68 |
| 7,334,422 B2 | 2/2008 | Zywiat et al. | |
| 7,966,804 B2 * | 6/2011 | Snow | 60/39.83 |

* cited by examiner

*Primary Examiner* — Eric S McCall
(74) *Attorney, Agent, or Firm* — David J. Clement, Esq.; Armstrong Teasdale LLP

(57) ABSTRACT

A method for testing a cooling system for use in a gas turbine engine control system is provided. The method includes connecting an inlet of the cooling system to a differential pressure sensor, connecting an outlet of the cooling system to the differential pressure sensor, and determining whether or not a difference in pressure exists between the inlet and outlet, wherein such a pressure difference is indicative of whether cooling fluid is flowing through the cooling system.

7 Claims, 4 Drawing Sheets

METHOD FOR TESTING GAS TURBINE ENGINES

This application is a divisional application of U.S. patent application Ser. No. 11/485,493 (now U.S. Pat. No. 7,966,804), filed Jul. 12, 2006, which is hereby incorporated by reference in its entirety.

STATEMENT REGARDING FEDERALLY SPONSORED RESEARCH & DEVELOPMENT

This invention was made with Government support under contract number N00019-96-C-0176. The Government may have certain rights in this invention.

BACKGROUND OF THE INVENTION

This invention relates generally to gas turbine engines, and more specifically, to a method and apparatus for monitoring cooling flow to electronic controls.

At least some known gas turbine engines include cooling systems that utilize fuel flows to facilitate cooling components within the gas turbine engine. For example, known cooling systems are used to regulate the temperature of a full authority digital engine control (FADEC) system used with the gas turbine engine. To facilitate maintenance, often no-leak quick-disconnect fittings are used to connect adjacent cooling lines in the cooling system. Moreover, such fittings also facilitate assembly of the engine to the aircraft.

At least some known gas turbine engines include electronic components that are cooled using fuel. Specifically, fuel is channeled from a supply to each electronic component wherein it is routed through a mechanism to facilitate cooling the electronic components. Spent cooling fuel is then returned to the fuel supply. If an electronic component is not properly cooled, the electronic component could overheat and the electronic component could fail.

BRIEF DESCRIPTION OF THE INVENTION

In one aspect, a method for testing a cooling system for use in a gas turbine engine control system is provided. The method includes connecting an inlet of the cooling system to a differential pressure sensor, connecting an outlet of the cooling system to the differential pressure sensor, and determining whether or not a difference in pressure exists between the inlet and outlet, wherein such a pressure difference is indicative of whether cooling fluid is flowing through the cooling system.

In a further aspect, a cooling system for a gas turbine engine control system is provided. The cooling system includes an inlet portion coupled in fluid communication with a source of cooling fluid. The inlet portion is configured to channel cooling fluid from the cooling fluid source to the control system to facilitate cooling the control system. The cooling system also includes an outlet portion configured to channel cooling fluid from the control system to one of the cooling fluid source and a reservoir. The cooling system further includes a differential pressure sensor in flow communication with the inlet portion and the outlet portion. The differential pressure sensor is configured to sense whether a pressure difference exists within the inlet and outlet portions.

In a further aspect, a gas turbine engine is provided. The gas turbine engine includes a compressor, a combustor in flow communication with said compressor, a turbine in flow communication with said combustor, a control system, and a cooling system. The cooling system includes an inlet portion coupled in fluid communication with a source of cooling fluid. The inlet portion is configured to channel cooling fluid from the cooling fluid source to the control system to facilitate cooling the control system. The cooling system further includes an outlet portion configured to channel cooling fluid from the control system to one of the cooling fluid source and a reservoir. The cooling system also includes a differential pressure sensor in flow communication with the inlet portion and the outlet portion. The differential pressure sensor is configured to sense whether there is a difference in pressure between cooling fluid within the inlet and outlet portions.

DETAILED DESCRIPTION OF THE INVENTION

Figure 1:
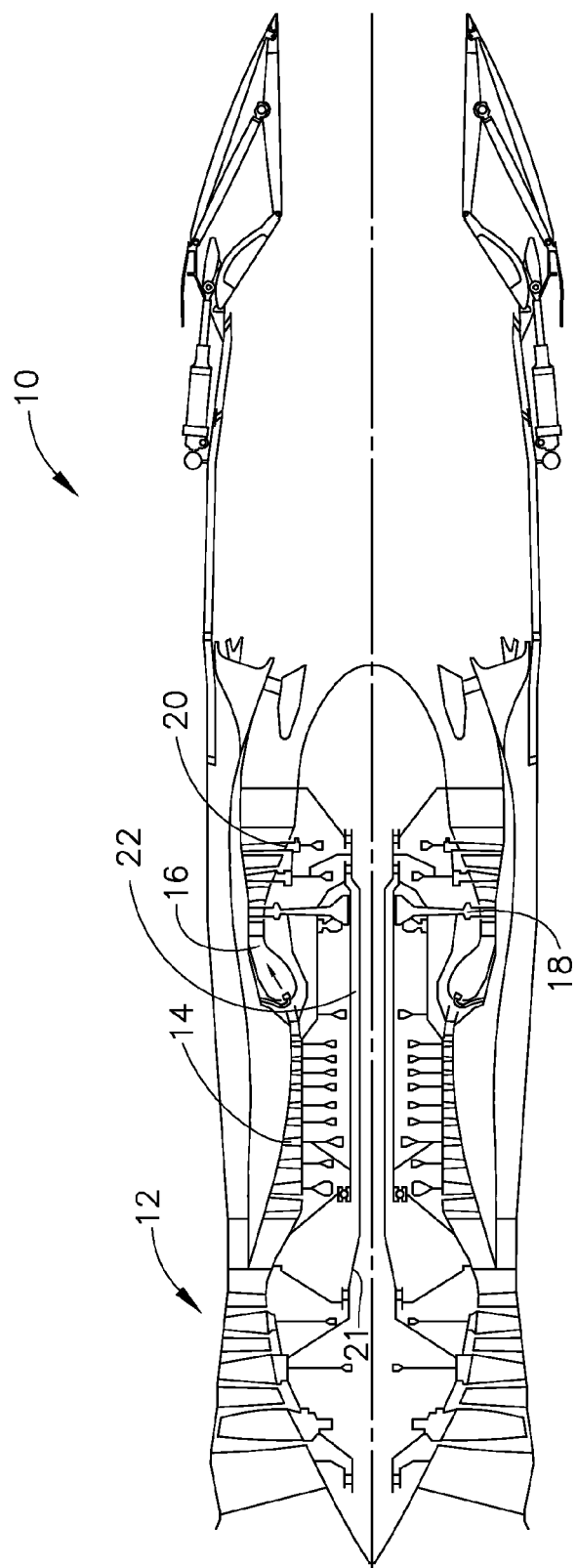
FIG. 1 is a schematic illustration of an exemplary gas turbine engine.

FIG. 1 is a schematic illustration of an exemplary gas turbine engine 10 including a low pressure compressor 12, a high pressure compressor 14, and a combustor 16. Engine 10 also includes a high pressure turbine 18 and a low pressure turbine 20. Compressor 12 and turbine 20 are coupled by a first shaft 21, and compressor 14 and turbine 18 are coupled by a second shaft 22. Gas turbine engine 10 may include one or more electronic controls.

In operation, air flows through low pressure compressor 12 and a portion of that compressed air is channeled to high pressure compressor 14. The highly compressed air is channeled to combustor 16, where it is mixed with fuel and ignited to produce a combustion gas flow that drives turbines 18 and 20.

Figure 2:
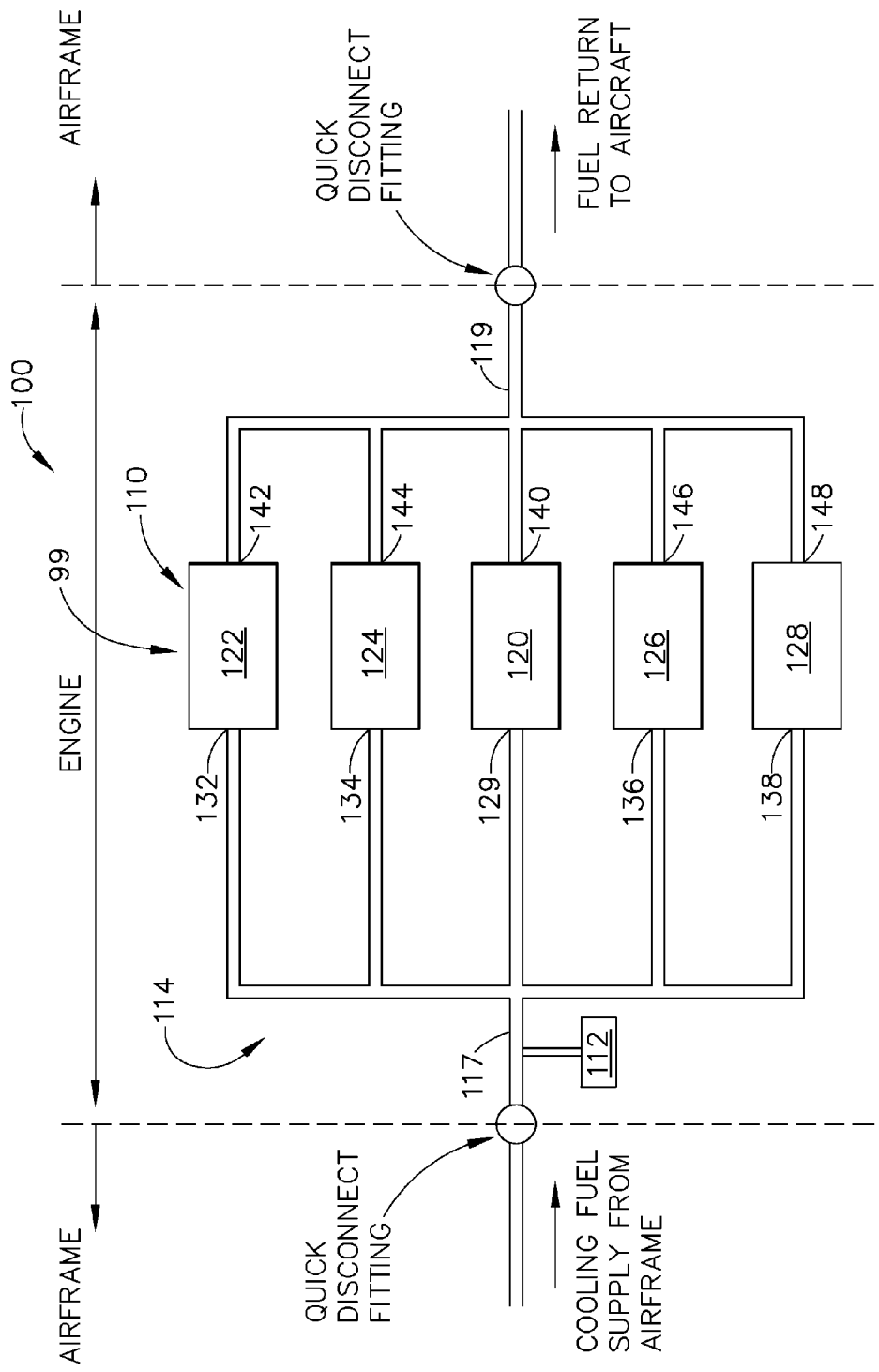
FIG. 2 is a schematic illustration of an exemplary control system and associated cooling system for use with a gas turbine engine, for example the engine shown in FIG. 1.
Figure 3:
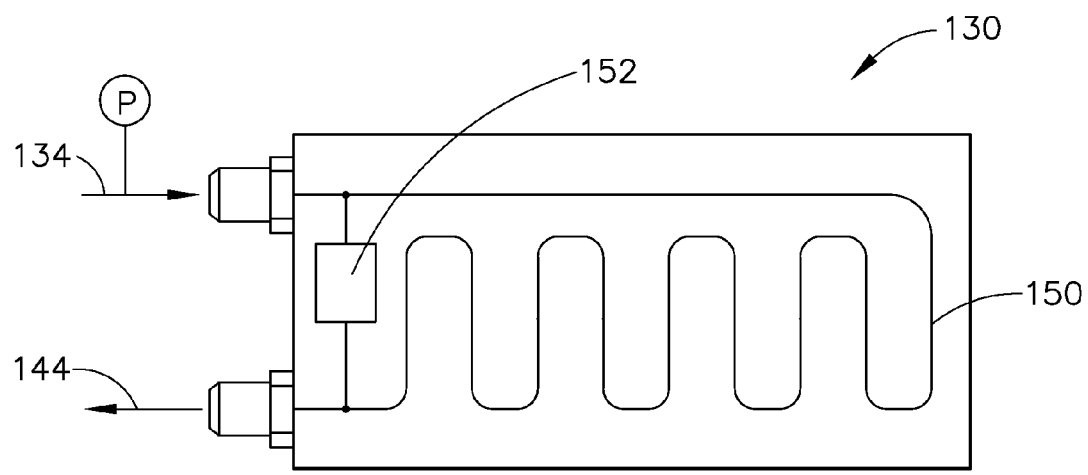
FIG. 3 is a schematic illustration of a cooling plate for use with the cooling system shown in FIG. 2.

FIG. 2 is a schematic illustration of an exemplary electronic control system 99 for use with a gas turbine engine, for example engine 10 (shown in FIG. 1), and an exemplary cooling system 100 for use with control system 99. FIG. 3 is a schematic illustration of a cooling plate 130 that may be used with cooling system 100. A cooling plate 130 is a mechanism used to facilitate cooling of electronic components of electronic control system 99. Cooling plate 130 is typically adjacent to an electronic component, and includes a passage, channels, or any other suitable means to enable fuel to flow through cooling plate 130. As fuel flows through the passage or channels, the electronic component is cooled.

In the exemplary embodiment, control system 99 includes a plurality of control subsystems 110 for use in controlling engine 10. Although five control subsystems 110 are illustrated, control system 99 may include any number of control subsystems 110 for controlling any number of functions of engine 10 and/or related to engine 10. Moreover, control system 99 may include any suitable type of control subsystem(s) 110 each for use in controlling any function(s) related to engine 10. As shown in FIG. 2, cooling system 100 also includes a pressure sensor 112. Sensor 112 senses, at least in part, whether there is cooling fluid pressure within cooling system 100 indicating whether cooling fluid is capable of flowing from a fuel source. Sensor 112 may be any suitable device and/or means used to sense operational pressure. Sensor 112 is positionable anywhere within cooling system 100 that enables sensor 112 to measure whether there the capability of cooling fluid to flow from a fuel source. Alternatively, sensor 112 is positioned within the aircraft prior to the quick-disconnect fittings. Alternatively, cooling system 100 does not include sensor 112. The ability to confirm cooling flow in any one of the control subsystems 110 assures that quick-disconnect fittings at the supply and return are connected, so that cooling fluid will flow to provide cooling when the engine is running.

In the exemplary embodiment, control system 99 includes a prognostics and health area manager (PHAM) control subsystem 120 for system monitoring, a plurality of full authority digital engine control (FADEC) control subsystems 122 and 124 for engine and power plant control, an ignition control subsystem 126 for ignition control and monitoring, and an anti-ice control subsystem 128 for control of engine inlet anti-icing. FADEC control subsystems 122 and 124 include thermal inertia such that FADEC control subsystems 122 and 124 include the ability of to conduct and store heat. Control system 99 may be coupled at any suitable location on, within, and/or adjacent engine 10. Alternatively, control system 99 may be located away from engine 10.

Cooling system 100 includes a conduit system 114 that is coupled to a source (not shown) of cooling fluid. Any suitable cooling fluid that enables cooling system 100 to function as described herein may be utilized in cooling system 100. For example, in the exemplary embodiment, the cooling fluid is a fuel, such as, but not limited to, fuel used to operate engine 10. Moreover, the cooling fluid may be any suitable source at any suitable location, whether onboard or remote from engine 10. For example, in the exemplary embodiment, the source of cooling fluid is a fuel tank (not shown) that supplies fuel to engine 10 for producing the combustion gas flow.

Cooling fluid is channeled from the cooling fluid source into conduit system 114 wherein the fluid is channeled to and/or adjacent to each control subsystem 110 to facilitate cooling thereof. In the exemplary embodiment, control subsystems 110 are positioned relative to conduit system 114 in a parallel flow relationship with respect to one another for receiving cooling fluid. In the exemplary embodiment, control subsystems 110 are positioned in parallel such that if one control subsystem 110 is receiving cooling fluid, each control subsystem 110 is receiving cooling fluid. In an alternative embodiment, control subsystems 110 may be positioned relative to conduit system 114 in a series flow relationship with respect to one another for receiving cooling fluid. In other embodiments, at least some of control subsystems 110 are in a series flow relationship while at least some others are in a parallel flow relationship.

In the exemplary embodiment, conduit system 114 includes an inlet portion 117 and an outlet portion 119. Inlet portion 117 extends to each of the plurality of control subsystems 110 to channel cooling fluid from the cooling fluid source to, and/or adjacent to, each control subsystem 110. Outlet portion 119 channels cooling fluid from, and/or adjacent from, each of control subsystems 110 to the cooling fluid source and/or to a reservoir (not shown). For example, in the exemplary embodiment, the cooling fluid is channeled through conduit system 114 from inlet portion 117 to an inlet portion 129, 132, 134, 136, and 138 associated with each of PHAM 120, FADEC 122, FADEC 124, ignition control subsystem 126, and anti-ice control subsystem 128, respectively, and from an outlet portion 140, 142, 144, 146, and 148 associated with each of PHAM 120, FADEC 122, FADEC 124, ignition control subsystem 126, and anti-ice control subsystem 128, respectively, to the cooling fluid source and/or the reservoir.

The cooling fluid may cool each control subsystem 110 using any suitable process, structure, and/or means. As such, and as described above, inlet portions 129, 132, 134, 136, and 138 may channel cooling fluid directly to one or more of respective subsystems 120, 122, 124, 126, and/or 128, or alternatively may channel cooling fluid adjacent to one or more of respective subsystems 120, 122, 124, 126, and/or 128. For example, in the exemplary embodiment, each subsystem 120, 122, 124, 126, and 128 includes a cooling plate 130 coupled thereto. Inlet portions 129, 132, 134, 136, and 138 and outlet portions 140, 142, 144, 146, and 148 are coupled in flow communication to each control subsystem cooling plate 130 for channeling cooling fluid thereto. In the exemplary embodiment, a cooling plate 130 is coupled in contact with at least a portion of each control subsystem 110 to facilitate cooling each control subsystem 110. Moreover, in other embodiments, in addition to, or alternatively to, cooling plate 130, one or more control subsystems 110 may be cooled using other structures and/or means.

The cooling fluid may facilitate cooling each cooling plate 130 using any suitable process, structure, and/or means. For example, as shown in FIG. 3, in the exemplary embodiment, each cooling plate 130 is formed with, or includes, a channel 150. In the exemplary embodiment, channel 150 is coupled to, and/or is adjacent to, one side of cooling plate 130 or may extend along both sides of cooling plate 130. Additionally, or alternatively, channel 150 may be an internal passageway that extends through cooling plate 130. Each channel 150 is coupled in flow communication with a respective inlet portion 129, 132, 134, 136, and 138 and a respective outlet portion 140, 142, 144, 146, and 148 of each respective subsystem 120, 122, 124, 126, and 128. When channel 150 is positioned within or, adjacent to, cooling plate 130, heat is conducted from each respective subsystem 120, 122, 124, 126, and 128 to cooling plate 130 and then is convected out by the flowing fuel.

As shown in FIG. 3, cooling plate 130 includes fittings positioned between inlet portion 117 and outlet portion 119. Fittings may be any suitable seal positioned between inlet portion 117 and outlet portion 119 to cooling plate 130. More specifically, in the exemplary embodiment, cooling fluid flows into cooling plate 130 through inlet portion 134 and exits cooling plate 130 through outlet portion 144.

In the exemplary embodiment, control subsystem 110 includes a differential pressure sensor (DPS) 152. For example, in the exemplary embodiment, DPS 152 is a differential pressure switch. In addition to, or alternatively to, DPS 152 may be any suitable device and/or means used to sense a difference in pressure. DPS 152 is positionable anywhere within cooling system 100, cooling plate 130, or within control subsystem 110. DPS 152 measures a pressure difference between portions of cooling system 100. In one embodiment, the difference in pressure in cooling system 100 is measured by calculating a difference in pressure between an inlet and an outlet of cooling system 100. In a particular embodiment, DPS 152 may be fluidly coupled to inlet portion 117 and outlet portion 119 for sensing a difference in pressure of cooling fluid within inlet and outlet portions 117 and 119.

In the exemplary embodiment, DPS 152 is positioned in flow communication between inlet portion 134 and outlet portion 144. As such, DPS 152 senses a difference in pressure between cooling fluid flowing through inlet portion 134 and cooling fluid flowing through outlet portion 144. A sensed difference in pressure indicates cooling fluid is flowing through cooling system 100. Moreover, in the exemplary embodiment, because control subsystems 110 are positioned in a parallel flow relationship relative to cooling system 100, if DPS 152 senses a difference in pressure between cooling fluid inlet portion 134 and outlet portion 144, such a difference indicates that cooling fluid is also flowing to, and/or adjacent to, those specific control subsystems 110.

Figure 4:
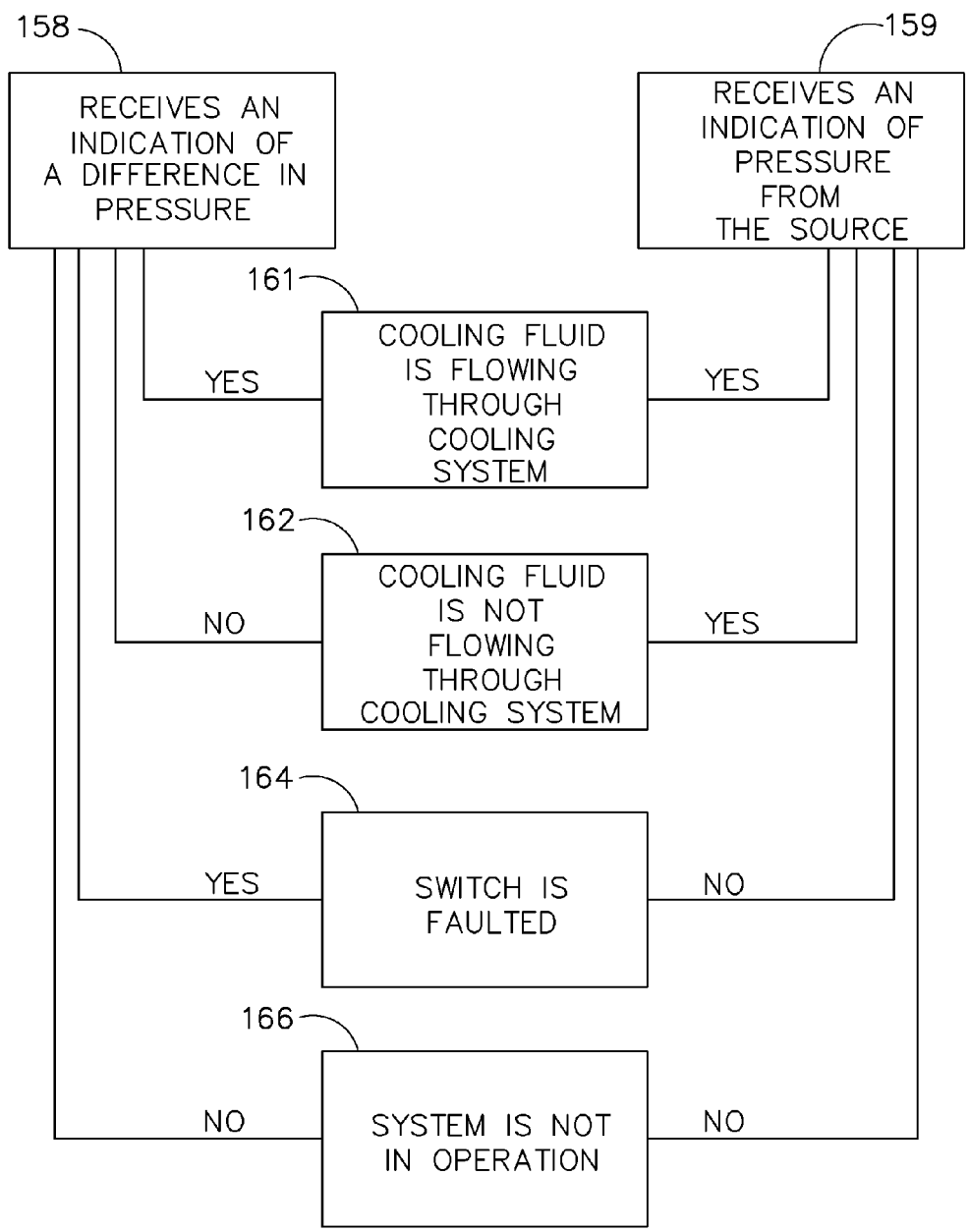
FIG. 4 is a logic diagram illustrating an exemplary method for testing a cooling system, for example the cooling system shown in FIG. 2.

FIG. 4 is a flowchart illustrating exemplary logic used when testing cooling system 100 utilizing DPS 152 (shown in FIG. 3). During operation, cooling system 100 provides cooling flow to each control subsystem 110 of engine 10. Specifically, in the exemplary embodiment, fuel flows from the fuel tank at tank boost pressure through conduit system 114 to each of control subsystems 110.

In one embodiment, DPS 152 and sensor 112 cooperate to verify the difference in pressure and the pressure signals from the fuel source supplied to cooling system 100 are present confirming that cooling fuel is capable of flowing through cooling system 100. DPS 152 is electrically coupled to a processor-based application (not shown). Sensor 112 is also electrically coupled to the processor-based application. The term processor, as used herein, refers to microprocessors, application specific integrated circuits (ASIC), logic circuits, and any other circuit or processor capable of testing cooling system 100 as described herein. For example, in the exemplary embodiment, DPS 152 is electrically coupled to the processor-based application located within a control subsystem 110. More specifically, in the exemplary embodiment, the processor-based application is located within PHAM 120. Alternatively, the processor-based application may be located within a portion of control system 99. DPS 152 and sensor 112 verify the difference in pressure and the pressure signals from the fuel source supplied to cooling system 100 are present. 112

The processor-based application receives an indication 158 from DPS 152 of whether a difference in pressure exists between inlet portion 117 and outlet portion 119. A difference in pressure sensed between cooling fluid within inlet portion 117 and outlet portion 119 is indicative of whether cooling fluid is flowing through cooling system 100. For example, in the exemplary embodiment, DPS 152 is in a closed position prior to sensing a difference in pressure between inlet portion 117 and outlet portion 119. Alternatively, DPS 152 may be in an open position when there is a difference in pressure between inlet portion 117 and outlet portion 119. In the exemplary embodiment, the processor-based application also receives an indication 159 from sensor 112 that there is pressurized fluid within cooling system 100 such that pressurized fluid is supplied from the fuel source to cooling system 100.

In the exemplary embodiment, if sensor 112 detects pressure and DPS 152 is in a closed position signifying a difference in pressure between inlet portion 117 and outlet portion 119, then the processor-based application will conclude that cooling fluid is flowing through cooling system at 161.

In the exemplary embodiment, if sensor 112 detects pressure and DPS 152 is in an open position signifying there is no difference in pressure between inlet portion 117 and outlet portion 119, then the processor-based application will conclude that cooling fluid is not flowing through cooling system at 162. If cooling fluid is not flowing through cooling system 100, processor-based application will output a warning. For example, in the exemplary embodiment, the warning is an alarm.

In the exemplary embodiment, if sensor 112 does not detect cooling fluid is flowing from the source of cooling fluid and DPS 152 is in a closed position, then the processor-based application will conclude that the switch is faulted 164.

In the exemplary embodiment, if sensor 112 does not detect cooling fluid is flowing from the source of cooling fluid and DPS 152 is in an open position, then the processor-based application will conclude that the system is not in operation 166. The method herein tests cooling system 100 for use in a gas turbine engine 10 control system 110. The method includes connecting an inlet 117 of cooling system 100 to a DPS 152. The method further includes connecting an outlet 119 of cooling system 100 to the DPS 152, and determining whether or not a difference in pressure exists between the inlet and outlet 117 and 119 wherein such a pressure difference is indicative of whether cooling fluid is flowing through the cooling system 100.

The above-described cooling system facilitates preventing electronic failure in an engine for lack of coolant flow. More specifically, the cooling system can be tested to see if fuel is flowing therethrough. The test is utilized after engine installation or after a maintenance action on the engine. The test can also be conducted after starting the engine and either prior to takeoff of the plane. Additionally, the test can be conducted while the plane is in the air.

Exemplary embodiments of cooling systems are described above in detail. Each cooling system is not limited to use with the specific embodiments described herein, but rather, each cooling system can be utilized independently and separately from other components described herein. Moreover, the invention is not limited to the embodiments of the differential pressure switches described above in detail. Rather, other variations of differential pressure transducers or sensors may be utilized within the spirit and scope of the claims.

While the invention has been described in terms of various specific embodiments, those skilled in the art will recognize that the invention can be practiced with modification within the spirit and scope of the claims.

What is claimed is:

1. A method for testing a cooling system for use in a gas turbine engine control system, said method comprising:
   connecting an inlet of the cooling system to a differential pressure sensor;
   connecting an outlet of the cooling system to the differential pressure sensor;
   determining whether the cooling fluid is pressurized using a first pressure sensor operatively coupled to the gas turbine engine control system;
   determining whether or not a difference in pressure exists between the inlet and outlet, wherein such a pressure difference is indicative of whether cooling fluid is flowing through the cooling system; and
   generating a signal that indicates at least one of the inlet and the outlet is disconnected based at least in part on an indication received from the differential pressure sensor that there is not the difference in pressure between cooling fluid within the inlet and outlet.

2. A method in accordance with claim 1 wherein the differential pressure sensor is a differential pressure switch, said method further comprises receiving an indication from the differential pressure switch comprises receiving an indication of whether the differential pressure switch is in one of an open position and a closed position.

3. A method in accordance with claim 1 further comprising receiving an indication from a pressure sensor that cooling fluid pressure is supplied to the cooling system.

4. A method in accordance with claim 1 further comprising generating an indication that the differential pressure sensor has failed based, at least in part, on an indication received from the differential pressure sensor that a pressure difference exists between cooling fluid within the inlet and outlet and an indication from a pressure sensor that there is no cooling fluid pressure supplied to the cooling system.

5. A method in accordance with claim 1 further comprising:
   generating a warning that cooling fluid is not flowing through the cooling system based, at least in part, on an indication received from the differential pressure sensor that there is not the difference in pressure between cooling fluid within the inlet and outlet.

6. A method in accordance with claim 5 wherein generating a warning that cooling fluid is not flowing through the cooling system further comprises generating a warning that is also based, at least in part, on an indication from a pressure sensor that there is cooling fluid pressure supplied to the cooling system.

7. A method for testing a cooling system for use in a gas turbine engine control system, said method comprising:
   coupling a differential pressure sensor between an inlet and an outlet of the cooling system, the differential pressure sensor configured to sense a pressure difference between the inlet and the outlet of the cooling system;
   coupling a first pressure sensor to the gas turbine engine control system, the first pressure sensor configured to determine whether the cooling fluid is pressurized;
   determining whether or not a difference in pressure exists between the inlet and outlet, wherein such a pressure difference is indicative of whether cooling fluid is flowing through the cooling system; and
   determining a fault in the differential pressure sensor when said differential pressure sensor indicates a pressure difference and the first pressure sensor determines that the cooling fluid is not pressurized.

* * * * *